(12) United States Patent
Kubota

(10) Patent No.: US 7,359,165 B2
(45) Date of Patent: Apr. 15, 2008

(54) SUPERCONDUCTING CURRENT LIMITING ELEMENT

(75) Inventor: Hiroshi Kubota, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 462 days.

(21) Appl. No.: 11/024,686

(22) Filed: Dec. 30, 2004

(65) Prior Publication Data
US 2005/0153843 A1 Jul. 14, 2005

(30) Foreign Application Priority Data
Jan. 9, 2004 (JP) ............................. 2004-003570

(51) Int. Cl.
*H02H 7/00* (2006.01)
(52) U.S. Cl. ....................................... 361/19
(58) Field of Classification Search .................. 361/19; 338/32 S, 13; 505/237, 238
See application file for complete search history.

(56) References Cited
U.S. PATENT DOCUMENTS

| | | | | |
|---|---|---|---|---|
| 3,021,434 A | * | 2/1962 | Blumberg et al. | 327/371 |
| 4,994,932 A | * | 2/1991 | Okamoto et al. | 361/19 |
| 5,173,678 A | * | 12/1992 | Bellows et al. | 505/211 |
| 5,235,309 A | * | 8/1993 | Preisler et al. | 361/19 |
| 5,600,522 A | * | 2/1997 | Hull | 361/19 |
| 6,337,785 B1 | * | 1/2002 | Okazaki | 361/19 |
| 6,764,770 B2 | * | 7/2004 | Paranthaman et al. | 428/469 |

FOREIGN PATENT DOCUMENTS

| | | |
|---|---|---|
| JP | 8-223790 | 8/1996 |
| JP | 2954124 | 7/1999 |

* cited by examiner

*Primary Examiner*—Michael Sherry
*Assistant Examiner*—Terrence R. Willoughby
(74) *Attorney, Agent, or Firm*—Oblon, Spivak, McClelland, Maier & Neustadt, P.C.

(57) ABSTRACT

A superconducting current limiting element has a parallel circuit including a first superconductor and a normal conductor connected in parallel, and a second superconductor connected in series to the parallel circuit and having a critical current value higher than that of the first superconductor. Further, at least one of the normal conductor and the first superconductor, and the second superconductor are disposed on the same insulating substrate.

7 Claims, 6 Drawing Sheets

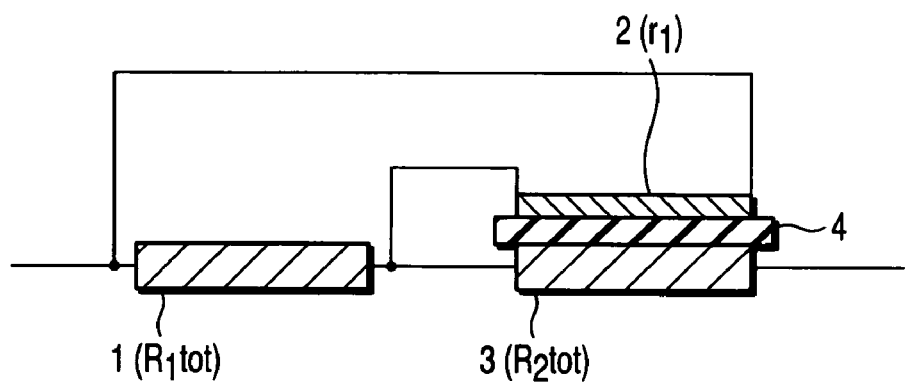
F I G. 2
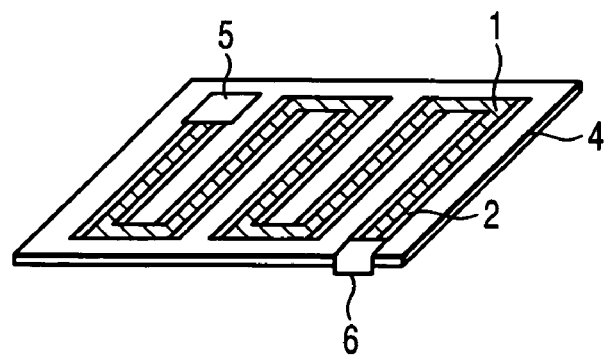
F I G. 3

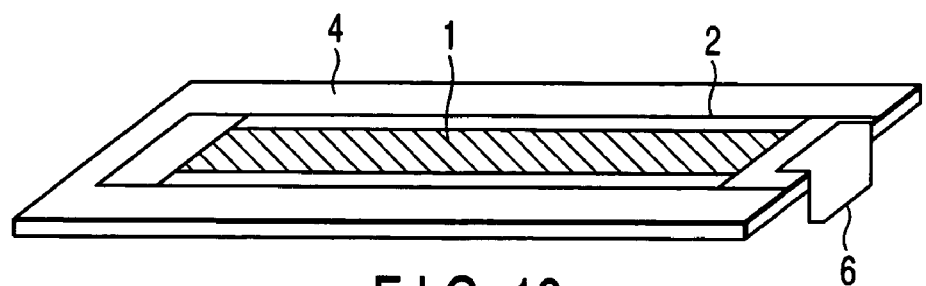
F I G. 10
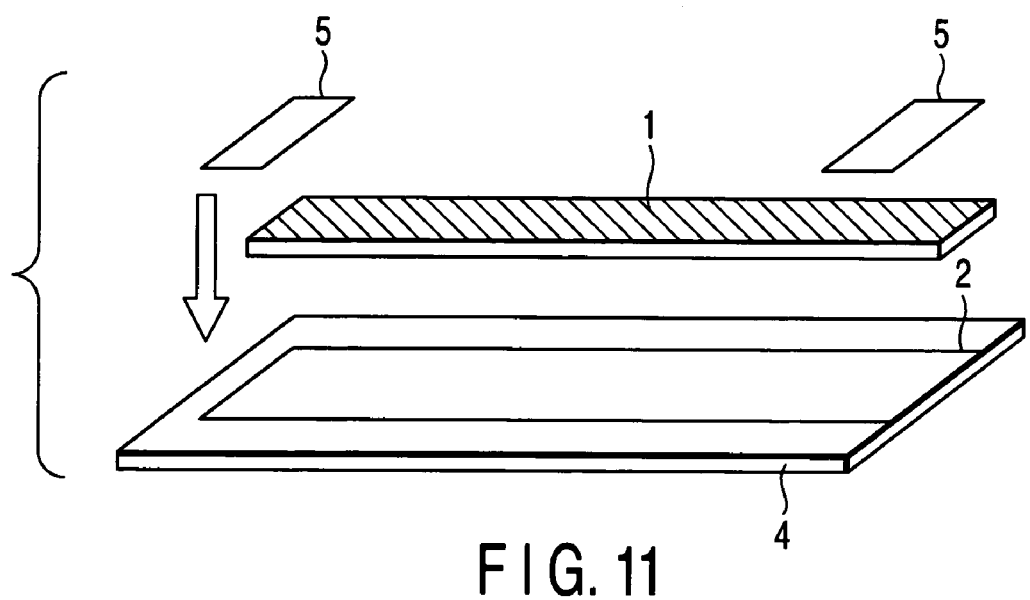
F I G. 11
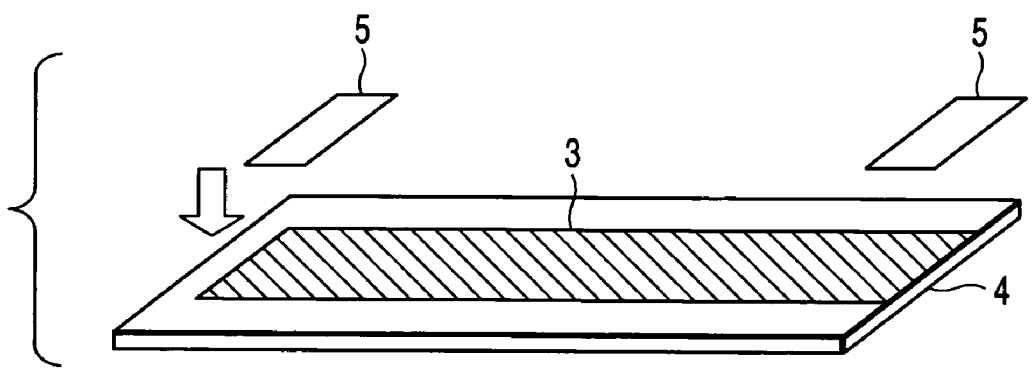
F I G. 12

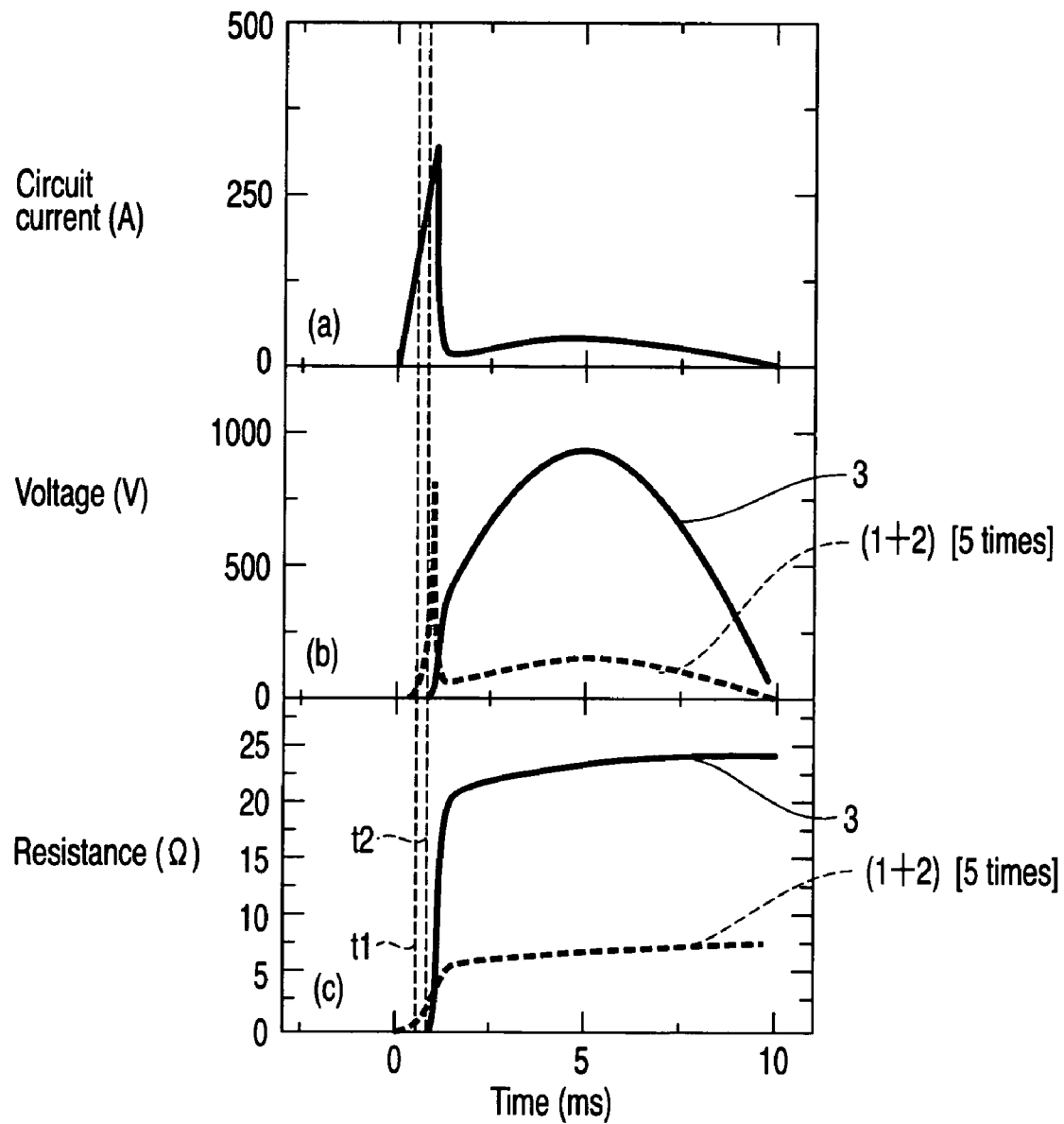
F I G. 16

SUPERCONDUCTING CURRENT LIMITING ELEMENT

CROSS-REFERENCE TO RELATED APPLICATIONS

This application is based upon and claims the benefit of priority from prior Japanese Patent Application No. 2004-003570, filed Jan. 9, 2004, the entire contents of which are incorporated herein by reference.

BACKGROUND OF THE INVENTION

1. Field of the Invention

The present invention relates to a superconducting current limiting element instantaneously suppresses an excessive current, such as a short circuit current transmitting electric power transmission lines, utilizing transition of a superconductor from a superconducting state to a normal-conducting state.

2. Description of the Related Art

A current limiting element is capable of conducting a current having a certain value or less while hardly generating a loss, but, when a high current is to be flowed, generates impedance to suppress the current. The current limiting element is applied to electric power equipment required to suppress a fault current due to short circuit or ground fault occurred in an electric power system. At present, various types of current limiting elements have been studied such as an element using arc discharge, and an element utilizing a semiconductor. Among them, a current limiting element referred to as a resistive superconducting current limiting element is studied in many research organizations. The resistive superconducting current limiting element utilizes a phenomenon that, when a high current is to be flowed, the superconductor cannot retain the superconducting state and becomes to produce a resistance through superconducting-to-normal transition. The element has superior features of high-speed operation and a compact design.

However, a superconductor cannot be used as a current limiting element if it is simply connected in series in the electric power system, because it is easily damaged in this case. A detailed mechanism why the superconductor is damaged has not been known at present, but the following causes are considered. That is, in the process of superconducting-to-normal transition due to the high current, a normal-conducting region is locally formed in the superconductor because of inhomogeneity of superconducting characteristics. It is considered that, if a high current not suppressed yet flows through the local normal-conducting region immediately after a current limiting operation is started, a very large amount of Joule heat is generated, which damages the superconductor. In addition, following the local temperature rise, high internal thermal stress is generated in the case of a bulk superconductor, or high interfacial thermal stress acts in the case of a superconducting thin film formed on an insulating substrate. Such thermal stress is also considered as a cause of damaging the superconductor.

Therefore, to manufacture a repeatedly operable resistive superconducting current limiting element, there is required such a measure as to make the normal-conducting region formed uniformly within the superconductor when an overcurrent flows, or to reduce the Joule heat generated in the normal-conducting region in an initial stage of the current limiting operation. Of the two methods, the latter method can be realized comparatively easily by connecting a resistor formed of a normal conductor in parallel with the superconductor. Therefore, most of the resistive superconducting current limiting elements which have been studied at present adopt such a structure.

FIG. 1 shows a conventional resistive superconducting current limiting element in which a normal conductor 102 is connected in parallel with a superconductor 101. This figure shows a state where a normal-conducting region 101a is locally formed within the superconductor 101 in the initial stage of the current limiting operation. Here, r denotes the resistance value of the normal conductor 102, and R denotes the resistance value of the normal-conducting region 101a in the superconductor 101.

Now, assume that the normal conductor 102 is not connected in parallel with the superconductor 101; In this case, quantity of heat W generated in the normal-conducting region 101a locally formed within the superconductor 101 is expressed by the following equation (1) and, in general, the quantity of heat W is remarkably high.

$$W = I^2 R \tag{1}$$

On the other hand, when the normal conductor 102 is connected in parallel with the superconductor 101 as shown in FIG. 1, a part of a current I is commuted to the normal conductor 102, and therefore the quantity of heat generated in the normal-conducting region 101a within the superconductor 101 can be reduced. However, the conventional resistive superconducting current limiting element shown in FIG. 1 also has a problem.

In the structure of FIG. 1, the quantity of heat W generated in the normal-conducting region 101a is expressed by the following equation (2):

$$W = \frac{rR}{(R+r)} I \times \frac{r}{(R+r)} I = \frac{r^2 R}{(R+r)^2} I^2. \tag{2}$$

In order to make the quantity of heat W represented by the equation (2) sufficiently lower than the quantity of heat W represented by the equation (1), it is necessary to satisfy the condition of the following equation (3):

$$r \ll R \tag{3}$$

Moreover, the normal-conducting region 101a formed in the initial stage of the current limiting operation is only a part of the whole superconductor 101. The resistance $R_{tot}$ of the superconductor 101 after it is totally converted into a normal conductor meets the following condition:

$$R \ll R_{tot} \tag{4}$$

Therefore, a combined resistance $R_{el}$ of the whole current limiting element is expressed by the following equation (5):

$$R_{el} = \frac{rR}{(r+R)} \cong r \ll R_{tot}. \tag{5}$$

That is, when the structure of FIG. 1 is adopted, the resistance of the whole current limiting element is remarkably low as compared with the resistance $R_{tot}$ of the superconductor. For example, in the case of using a Y-based superconducting thin film, it is known from a result of many experiments that the resistance r of the normal conductor 102 must be reduced by about one digit as compared with the resistance $R_{tot}$ of the superconductor 101. Thus, in order to produce a desired resistance value for the current limiting operation, it is necessary to connect a large number of current limiting elements having the structure of FIG. 1 in series.

Under the circumstances, methods to make the superconducting-to-normal transition cause uniformly with preventing the superconductor from being damaged in the initial stage of the current limiting operation has been studied as to a structure having no normal conductor or as to a structure in which a normal conductor of a high resistance is connected in parallel with the superconductor. Representative examples include a method of applying a magnetic field to the superconductor and a method of raising temperature of the superconductor using a heater so as to lower superconducting characteristics and cause the superconducting-to-normal transition in a wide area. However, these methods require a coil for generating the magnetic field or a heater. Moreover, these methods also require an overcurrent sensor for determining whether the coil or the heater is turned on and a power supply for supplying power to the coil or the heater. Therefore, it is difficult in these methods to make the current limiting element compact.

A current limiting element has also been proposed in which the current of the electric power system is supplied to a heater, when a superconductor is quenched, to raise the temperature of the superconductor without providing any external power supply (see Jpn. Pat. Appln. KOKAI Publication No. 8-223790). The above current limiting element makes it easy to cause uniformly the superconducting-to-normal transition. However, the current is supplied to the heater as a result of voltage generation by the superconductor, i.e., the formation of the local normal-conducting region in the superconductor occurs prior to the supply of the current to the heater in view of time sequence. Therefore, the Joule heat in the local normal-conducting region needs to be reduced in order to prevent the superconductor from being damaged. Consequently, the resistance of a resistor used as the heater connected in parallel with the superconductor needs to satisfy the relation of the above equation (3). That is, the above current limiting element can reduce a time required for the whole superconductor to be converted into a normal conductor, but it cannot increase the resistance.

BRIEF SUMMARY OF THE INVENTION

A superconducting current limiting element according to an aspect of the present invention comprises: a parallel circuit including a first superconductor and a normal conductor connected in parallel; and a second superconductor connected in series to the parallel circuit and having a critical current value higher than that of the first superconductor, at least one of the normal conductor and the first superconductor, and the second superconductor being disposed on the same insulating substrate.

A superconducting current limiting element according to another aspect of the present invention comprises: an insulating substrate; a parallel circuit including a first superconductor and a normal conductor connected in parallel, the first superconductor and the normal conductor being formed on a first surface of the insulating substrate; and a second superconductor connected in series to the parallel circuit and having a critical current value higher than that of the first superconductor, the second superconductor being formed on a second surface of the insulating substrate.

BRIEF DESCRIPTION OF THE SEVERAL VIEWS OF THE DRAWING

FIG. 2 is a schematic view of a superconducting current limiting element according to an embodiment of the present invention;

FIG. 3 is a perspective view of the superconducting current limiting element in Example 1 of the present invention;

FIG. 10 is a perspective view of the superconducting current limiting element in Example 3 of the present invention;

FIG. 11 is an exploded perspective view showing the upper surface of the superconducting current limiting element in Example 3 of the present invention;

FIG. 12 is an exploded perspective view showing the lower surface of the superconducting current limiting element in Example 3 of the present invention;

FIG. 16 is a diagram showing the current limiting characteristics of the superconducting current limiting element in Example 4 of the present invention.

DETAILED DESCRIPTION OF THE INVENTION

A principle of a superconducting current limiting element according to an embodiment of the present invention will be described with reference to FIG. 2. In FIG. 2, a first superconductor 1 is connected in parallel with a normal conductor 2. A second superconductor 3 is connected in series to the parallel circuit including the first superconductor 1 and the normal conductor 2. In FIG. 2, the normal conductor 2 and the second superconductor 3 are disposed on the same insulating substrate 4. In this figure, it is assumed that a resistance value where the whole first superconductor 1 is converted into a normal-conducting state is $R_{1tot}$, a resistance value of the normal conductor 2 is $r_1$, and a resistance value where the whole second superconductor 3 is converted into a normal-conducting state is $R_{2tot}$.

It should be noted that the first superconductor 1 and the second superconductor 3 may be disposed on the same insulating substrate 4. Also, the first superconductor 1 and the normal conductor 2 may be disposed on one surface of the insulating substrate 4, and the second superconductor 3 may be disposed on the opposite surface of the same insulating substrate 4.

In the superconducting current limiting element shown in FIG. 2, the normal conductor 2 satisfying the condition of $r_1 \ll R_{1tot}$ is also required in order to protect the normal-conducting region formed within the first superconductor 1 in the initial stage of the current limiting operation. This point is the same as that of the conventional superconducting current limiting element shown in FIG. 1. On the other hand, when an overcurrent is to be flowed in the superconducting current limiting element of FIG. 2, heat generated in the normal conductor 2 is applied to the second superconductor 3 through the insulating substrate 4, superconducting-to-normal transition occurs uniformly in the second superconductor 3, and the overcurrent can be instantaneously suppressed. That is, even when no resistor is connected in parallel with the second superconductor 3, the second superconductor 3 is not damaged, and the resistance $R_{2tot}$ of the whole second superconductor 3 can be utilized as a current limiting resistance. At this time, the resistance of the whole current limiting element of FIG. 2 is expressed by the following equation (6):

$$\left(\frac{R_{1tot} \times r_1}{R_{1tot} + r_1}\right) + R_{2tot} \approx r_1 + R_{2tot}. \tag{6}$$

Figure 1:
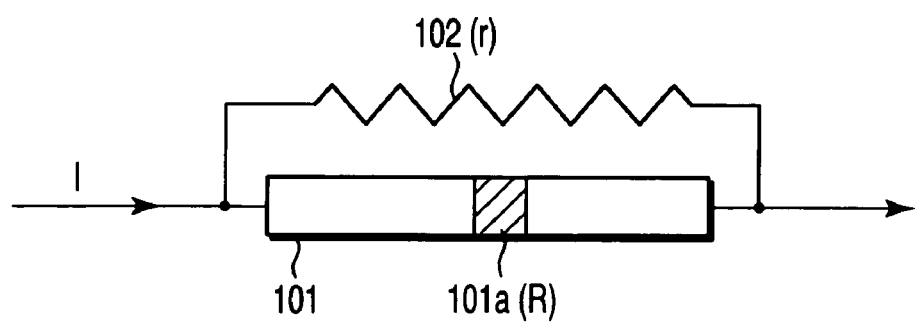
FIG. 1 is a schematic view of a conventional resistive superconducting current limiting element.

For comparison, consider the case where two conventional current limiting elements shown in FIG. 1 are connected in series. Here, it is assumed that a first normal conductor satisfying the condition of $r_1 \ll R_{1tot}$ is connected in parallel with the first superconductor ($R_{1tot}$), and a second normal conductor satisfying the condition of $r_2 \ll R_{2tot}$ is connected in parallel with the second superconductor ($R_{2tot}$). In this case, the whole resistance of two current limiting elements connected in series is expressed by the following equation (7):

$$\left(\frac{R_{1tot} \times r_1}{R_{1tot} + r_1}\right) + \left(\frac{R_{2tot} \times r_2}{R_{2tot} + r_2}\right) \approx r_1 + r_2 \ll r_1 + R_{2tot}. \tag{7}$$

The value of $r_1 + R_{2tot}$ in the equation (6) can be set to be remarkably higher than that of $r_1 + r_2$ in the equation (7). Therefore, a desired resistance value is obtained in a compact structure in the superconducting current limiting element according to the embodiment of the present invention.

However, in the structure of FIG. 2, since any resistor is not connected in parallel with the second superconductor 3, there is a possibility that the second superconductor 3 is damaged unless the second superconductor 3 is uniformly converted into the normal-conducting state by heating. In other words, the first superconductor 1 needs to cause the superconducting-to-normal transition earlier than the second superconductor 3, and the second superconductor 3 needs to cause the superconducting-to-normal transition uniformly by heating without spontaneous transition to the normal-conducting state. To make possible such processes of transitions, the value of the critical current $I_c$ of the first superconductor 1 needs to be smaller than that of the second superconductor 3, where the critical current $I_c$ is used as a criterion of the superconducting-to-normal transition.

Moreover, in the superconducting current limiting element shown in FIG. 2, it is necessary that the heat generated in the normal conductor 2 (or the first superconductor 1), which is used as a heater, is quickly conducted to the second superconductor 3. To this end, there are as few materials as possible between the normal conductor 2 (or the first superconductor 1) and the second superconductor 3. This is because an interface between different materials generally functions as a heat resistance. Therefore, it is preferable to adopt such a structure that, for example, the second superconductor 3 is formed on the insulating substrate 4, and the heat from the normal conductor 2 (or the first superconductor 1) is conducted through the insulating substrate 4 and is applied to the second superconductor 3.

Moreover, in the current limiting element of FIG. 2, the first superconductor 1 is connected in series to the second superconductor 3, and a criterion for a current capacity is given by a critical current value of the first superconductor 1 which is lower than that of the second superconductor 3. Therefore, even when the critical current value of the second superconductor 3 is fixed, the current capacity increases as the critical current value of the first superconductor 1 is increased. However, in the case where the first superconductor 1 has characteristics that it is hard to cause the superconducting-to-normal transition even when the current value flowing through the current limiting element largely exceeds the critical current value of the first superconductor 1, there is a possibility of increasing the danger that a fault current is increased before the temperature of the second superconductor 3 is raised and the transition of the second superconductor 3 to the normal-conducting state is spontaneously started, which damages the second superconductor 3. To avoid this danger, the first superconductor 1 preferably has a higher critical current density and causes transition to a normal-conducting state easier than the second superconductor. To that end, the first superconductor 1 is preferably formed of, for example, a superconductor film epitaxially deposited on an insulating substrate.

Moreover, to raise the temperature of the second superconductor 3 most efficiently, it is preferable that the first superconductor 1 and the normal conductor 2 are disposed on one surface of the insulating substrate 4, the second superconductor 3 is disposed on the opposite surface of the same insulating substrate 4, thereby the heat generated both in the first superconductor 1 and in the normal conductor 2 is conducted to the second superconductor 3.

It should be noted that, in order to perform the current limiting operation within a predetermined time of an order of msec after the fault current starts flowing, it is preferable that a thickness or the like of the insulating substrate is appropriately designed in accordance with thermal conductivity, heat capacity and the like of a material used for the substrate.

EXAMPLES

Example 1

Figure 4:
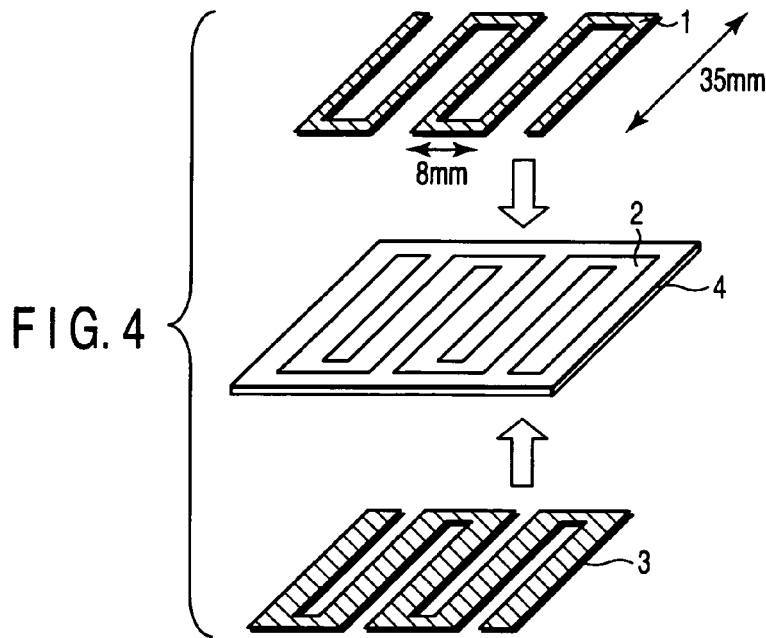
FIG. 4 is an exploded perspective view of the superconducting current limiting element in Example 1 of the present invention.

FIG. 3 is a perspective view of the superconducting current limiting element in this example. FIG. 4 is an exploded perspective view of the superconducting current limiting element in this example.

A normal conductor 2 made of a Ni thin film and processed into a meander shape was formed on one surface (upper surface) of an insulating substrate 4 made of sapphire having a thickness of 1 mm. A first superconductor 1 processed into a meander shape was formed on the normal conductor 2. In this case, a Y-based bulk superconductor was lapped into a plate having a thickness of 0.3 mm, and the plate was further processed into a meander-shaped strip having a width of 1 mm, and the resultant strip was used for the first superconductor 1. The total length of the first superconductor was about 200 mm. The first superconductor 1 was coated with a thin silver paste on one surface thereof, which was adhered to the normal conductor 2. A second superconductor 3 processed into a meander shape was formed on the other surface (lower surface) of the insulating substrate 4 (not shown in FIG. 3). The second superconductor 3 was made of the same material as that of the first superconductor 1 and processed into a similar shape as that of the first superconductor except that the width thereof was set to 2 mm. The second superconductor 3 was coated with a thin epoxy resin on one surface thereof, which was adhered to the lower surface of the insulating substrate 4. Silver having a thickness of about 3 μm was evaporated on one end of the first superconductor 1 and that of the normal conductor 2 and then was annealed at 400° C. for one hour in an oxygen atmosphere to form a current pad 5 to which a current lead is connected. A lead 6 for connecting the first superconductor 1 in series to the second superconductor 3 was formed using a silver mesh wire and silver paste.

A combined resistance of the first superconductor 1 and the normal conductor 2 was set to about 0.004Ω at a measured temperature of 100K based on a result of experiments repeatedly performed so as to provide a combined resistance value as high as possible in a range that the first superconductor 1 was not damaged in a current limiting operation time. Since any resistor was not connected in parallel with the second superconductor 3, the resistance of the second superconductor 3 was about 0.03Ω at 100K . The first superconductor 1 had $I_c$ of about 250 A and the second superconductor 3 had $I_c$ of about 500 A, respectively, under the liquid nitrogen temperature.

Figure 5:
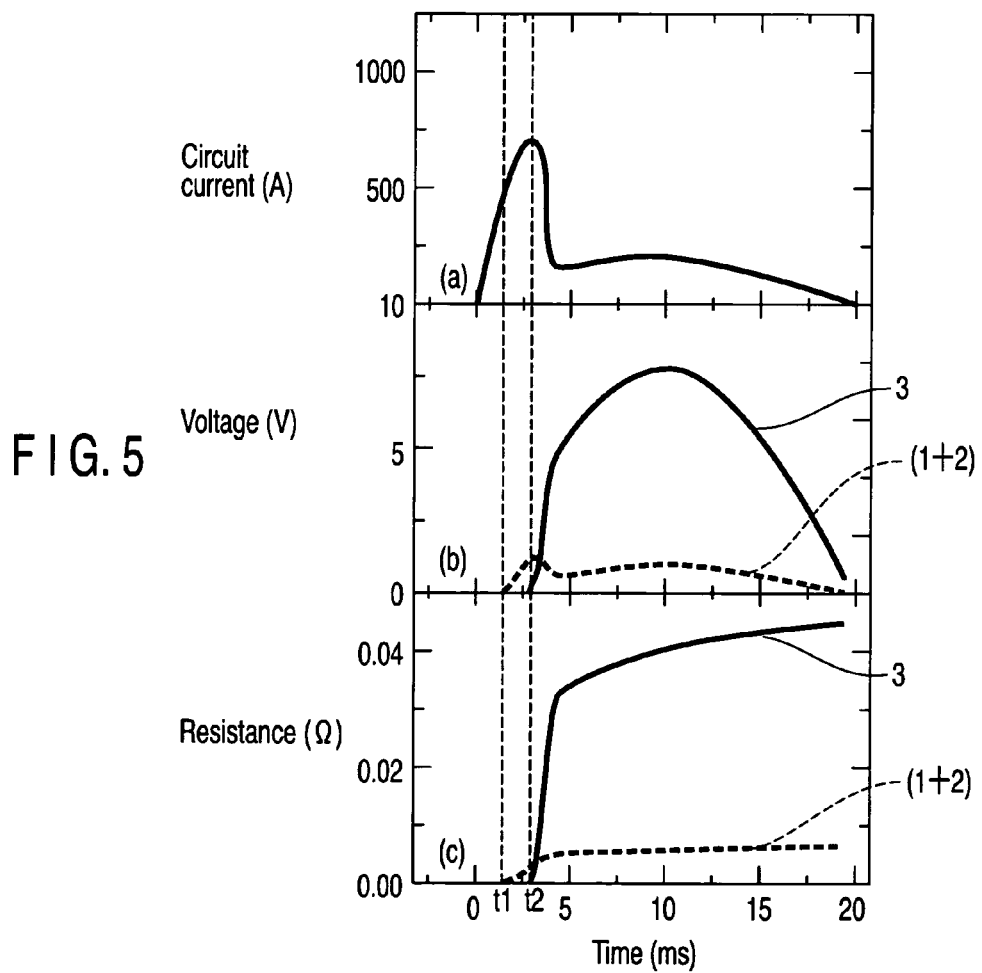
FIG. 5 is a diagram showing the current limiting characteristics of the superconducting current limiting element in Example 1 of the present invention.

The current limiting element fabricated in this manner was cooled in liquid nitrogen, and half-waves were supplied from an alternating-current power supply (peak voltage of 20V, resistance of 0.01Ω) of 50 Hz assuming a peak current value of 2000 A. FIG. 5 shows current limiting behavior of the current limiting element according to this example. In FIG. 5, (a) shows the circuit current, (b) shows the voltage generated in the element, and (c) shows the resistance of the element.

At the time $t_1$ when the circuit current reached about 500 A, the parallel circuit of the first superconductor 1 and the normal conductor 2 generated a voltage, and started to heat the second superconductor 3. Since the second superconductor 3 has a critical current $I_c$ twice that of the first superconductor 1, it is expected that the second superconductor 3 starts to generate a voltage when the circuit current reaches about 1000 A under a condition that the second superconductor 3 is not heated. However, the second superconductor 3 started to generate the voltage at the time $t_2$ when the circuit current reached about 700 A. It can be judged from the results that the second superconductor 3 caused the transition to the normal-conducting state by heating.

Figure 6:
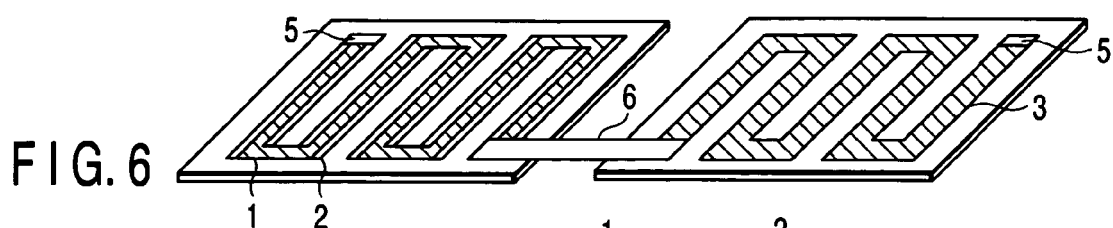
FIG. 6 is a perspective view of the superconducting current limiting element of a comparative example.

For comparison, as shown in FIG. 6, a current limiting element was fabricated by forming a first superconductor 1 and a normal conductor 2 on one sapphire substrate, forming a second superconductor 3 on the other sapphire substrate, and connecting in series the first superconductor 1 to the second superconductor 3. In the element of FIG. 6, the first superconductor 1 started to generate a voltage when the circuit current reached about 500 A, but the circuit current subsequently continued to increase, and the second superconductor 3 was damaged at a moment the circuit current reached about 1000 A.

Furthermore, a current limiting element was fabricated by connecting a normal conductor in parallel with the first superconductor, connecting a normal conductor in parallel with the second superconductor, and connecting in series the first superconductor 1 to the second superconductor 3. Current limiting experiments were repeatedly performed with respect to the particular current limiting element. It was found from a result of the experiments that the combined resistance of the second superconductor and the normal conductor needs to be lowered to 0.002Ω or less at a temperature of 100K in order to prevent the second superconductor from being damaged.

The above conventional element shows a resistance value of only (0.004+0.002)=0.006Ω (at 100K) even when the first and second superconductors are used. On the other hand, the current limiting element according to Example 1 shows a resistance value of (0.004+0.03)=0.034Ω (at 100K), which is as high as 5.5 times that of the conventional element.

It should be noted that the above resistance value is obtained at 100K, whereas the resistance value of the element changes with temperature and is not constant. As shown in FIG. 5, the resistance of the element rapidly increases and then gradually rises with reflecting the transition of the superconductor to the normal-conducting state. However, although the resistance of the element does not indicate a constant value as described above, the resistance value at a temperature of about 100K can be used as a criterion.

Example 2

Figure 7:
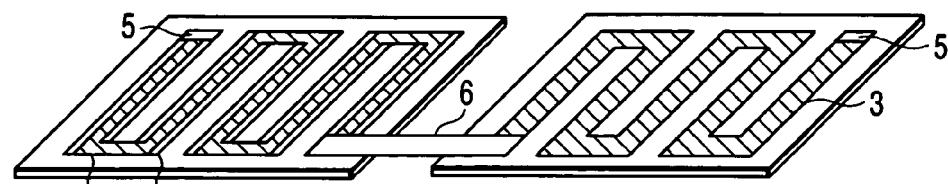
FIG. 7 is a perspective view showing the upper surface of the superconducting current limiting element in Example 2 of the present invention.
Figure 8:
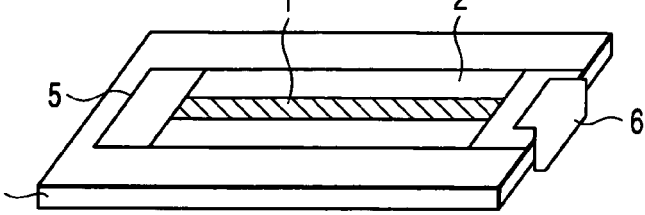
FIG. 8 is a perspective view showing the lower surface of the superconducting current limiting element in Example 2 of the present invention.

FIG. 7 is a perspective view showing the upper surface of the superconducting current limiting element in this example. FIG. 8 is a perspective view showing the lower surface of the superconducting current limiting element in this example.

A Ni thin film was deposited on the upper surface of an insulating substrate 4 made of sapphire having a width of 5 cm, a length of 15 cm, and a thickness of 1 mm, and processed into a strip having a width of 3 cm and a length of 12 cm to form a normal conductor 2. As a first superconductor 1, a wire made of a Y-based superconducting thin film deposited on a metal tape having a thickness of 100 μm, a width of 1 cm, and a length of 12 cm was used. The metal tape having the first superconductor 1 thereon was adhered to the normal conductor 2 made of the Ni thin film using epoxy resin. As a second superconductor 3, a Y-based superconducting thin film deposited on $CeO_2$ by an MOD method, which was epitaxially deposited on an R-plane sapphire, was used. The second superconductor 3 was formed into a strip having a width of 3 cm and a length of 12 cm in a position facing the normal conductor 2 through the substrate 4.

Current pads 5 were formed on both ends of the normal conductor 2 and the first superconductor 1 using a silver paste to connect in parallel with each other. Gold having a thickness of 50 nm was disposed as a protective film on the surface of the first superconductor 1. Current pads 5 were also formed on the both ends of the second superconductor 3 using the silver paste. A lead 6 for connecting the first superconductor 1 in series to the second superconductor 3 was formed using a silver mesh wire and silver paste.

A combined resistance of the first superconductor 1 and the normal conductor 2 was about 0.05Ω (at 100K), and a resistance of the second superconductor 3 was about 20Ω (at 100K). The first superconductor 1 had $I_c$ of about 50 A and the second superconductor 3 had $I_c$ of about 200 A, respectively, under the liquid nitrogen temperature.

Figure 9:
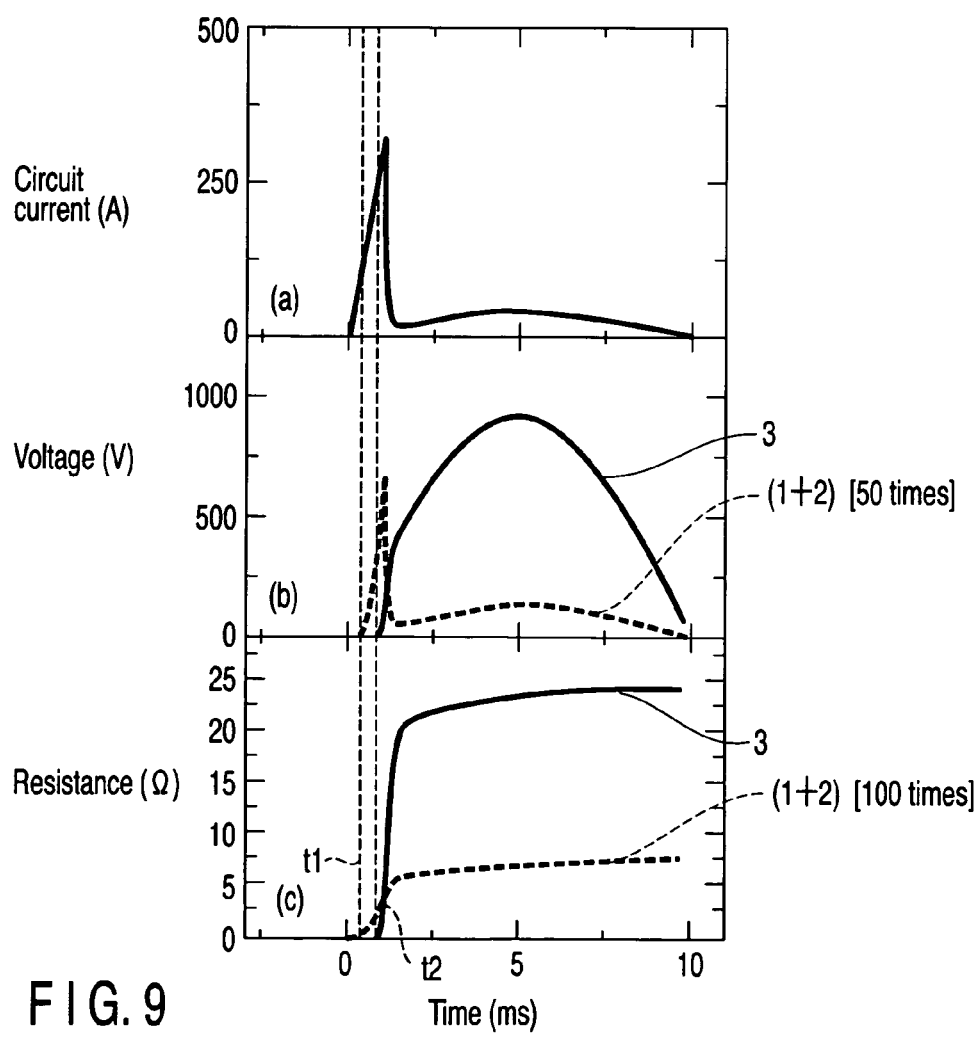
FIG. 9 is a diagram showing the current limiting characteristics of the superconducting current limiting element in Example 2 of the present invention.

The current limiting element fabricated in this manner was cooled in liquid nitrogen, and half-waves were supplied from an AC power supply (peak voltage of 1000V, internal resistance of 1Ω) of 50 Hz assuming a peak current value of 1000 A. FIG. 9 shows current limiting behavior of the current limiting element according to this example. In FIG. 9, (a) shows the circuit current, (b) shows the voltage generated in the element, and (c) shows the resistance of the element.

At the time $t_1$ when the circuit current reached about 120 A, the parallel circuit of the first superconductor 1 and the normal conductor 2 generated a voltage, and started to heat the second superconductor 3. As a result, the second superconductor 3 started to generate a voltage at the time $t_2$ when the circuit current reached about 250 A. It should be noted that, a conventional current limiting element fabricated by connecting a normal conductor in parallel with the second superconductor started to generated a resistance when the current value reached about 300 A in current limiting experiments. However, it was found that, in the above conventional element, the second superconductor was damaged unless the combined resistance of the second superconductor and the normal conductor was lowered to about 1Ω. It can be judged from these results that, in the current limiting element of this example, transition of the second superconductor to the normal-conducting state occurred uniformly by heating.

That is, the above conventional element shows a resistance value of only (0.05+1)=1.05Ω (at 100K) even when the first and second superconductors are used. On the other hand, the current limiting element according to Example 2 shows a resistance value of (0.05+20)=20.5Ω (at 100K), which is remarkably high as compared with the conventional element.

It should be noted that the time from the point where the first superconductor started to generate the voltage to the point where the transition of the second superconductor to the normal-conducting state was about 1 msec or more in Example 1, and was about 0.5 msec in Example 2, which was reduced by half as compared with Example 1. This is supposedly because Example 2 having no adhesive between the insulating substrate and the second superconductor enables efficient heat conduction as compared with Example 1 having an adhesive between the insulating substrate and the second superconductor.

Example 3

FIG. 10 is a perspective view showing a superconductor conducting current limiting element in this example. FIG. 11 is an exploded perspective view showing the upper surface of the superconducting current limiting element in this example. FIG. 12 is an exploded perspective view showing the lower surface of the superconducting current limiting element in this example.

Example 3 is different from Example 2 in that, as a first superconductor 1, a Y-based superconducting thin film epitaxially deposited on $CeO_2$ by evaporation, which was epitaxially deposited on a sapphire substrate having a thickness of 1 mm, a width of 1 cm, and a length of 12 cm, was used. Other constitution was similar to that of Example 2.

The first superconductor 1 had $I_c$ of about 130 A and the second superconductor 3 had $I_c$ of about 200 A, respectively, under the liquid nitrogen temperature. In this Example 3, the $I_c$ of the first superconductor 1, which determines a current capacity of a current limiting element, is as high as about 2.6 times that of Example 2. A combined resistance of the first superconductor 1 and the normal conductor 2 was about 1Ω (at 100K), and the resistance of the second superconductor 3 was about 20Ω (at 100K)

Figure 13:
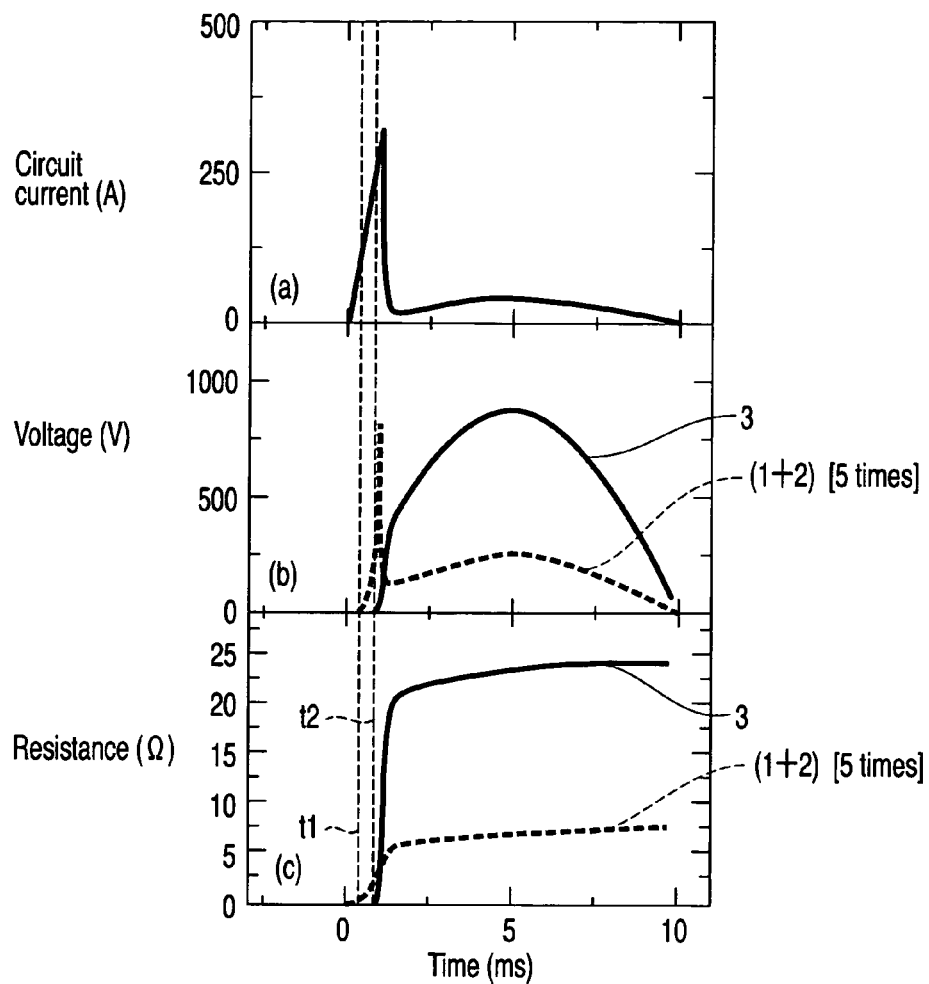
FIG. 13 is a diagram showing the current limiting characteristics of the superconducting current limiting element in Example 3 of the present invention.

The current limiting element fabricated in this manner was cooled in liquid nitrogen, and half-waves were supplied from an AC power supply (peak voltage of 1000V, internal resistance of 1Ω) of 50 Hz assuming a peak current value of 1000 A. FIG. 13 shows current limiting behavior of the current limiting element according to this example. In FIG. 13, (a) shows the circuit current, (b) shows the voltage generated in the element, and (c) shows the resistance of the element.

At the time $t_1$ when the circuit current reached about 180 A, the parallel circuit of the first superconductor 1 and the normal conductor 2 generated a voltage, and started to heat the second superconductor 3. As a result, the second superconductor 3 started to generate a voltage at the time $t_2$ when the circuit current reached about 240 A. Incidentally, it was found that, in a conventional current limiting element fabricated by connecting a normal conductor in parallel with the second superconductor, the second superconductor was damaged unless the combined resistance of the second superconductor and the normal conductor was lowered to about 2Ω from a result of current limiting experiments repeatedly performed. That is, the above conventional element shows a resistance value of only (1+2)=3Ω (at 100K) even when the first and second superconductors are used. On the other hand, the current limiting element according to Example 3 shows a resistance value of (1+20)=21Ω (at 100K), which is remarkably high as compared with the conventional element.

As described above, it is expected that the current limiting element of Example 3 shows a current capacity as high as 2.6 times that of Example 2. Here, a current limiting element having the similar structure to Example 2 was fabricated by using two wires of Y-based superconductor formed on a metal tape as first superconductors, in which $I_c$ of the first superconductors was 100 A, and current limiting experiments were performed. The current limiting element started to generate a voltage when the current value reached 260 A, but the circuit current subsequently continued to increase, and the second superconductor 3 was damaged when the circuit current reached about 330 A. This can be interpreted that much time was required for the superconducting-to-normal transition of the Y-based superconductor on the metal tape and therefore the circuit current was raised to such a high level that it brought about spontaneous transition of the second superconductor to the normal-conducting state before quantity of heat enough to cause uniformly transition of the second superconductor to the normal-conducting state could be generated. As seen from the above results, in order to fabricate a resistive superconducting current limiting element having a high resistance and a high current capacity, it is effective to use a superconducting thin film epitaxially deposited on an insulating substrate so as to cause the superconducting-to-normal transition quickly.

Example 4

Figure 14:
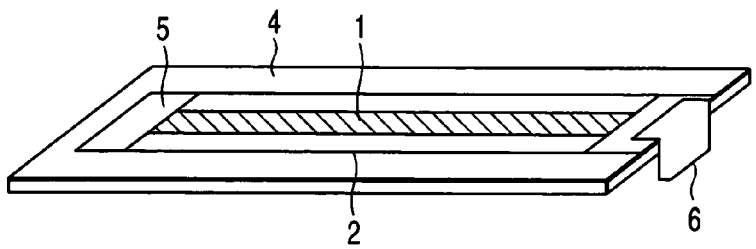
FIG. 14 is a perspective view of the upper surface of the superconducting current limiting element in Example 4 of the present invention.
Figure 15:
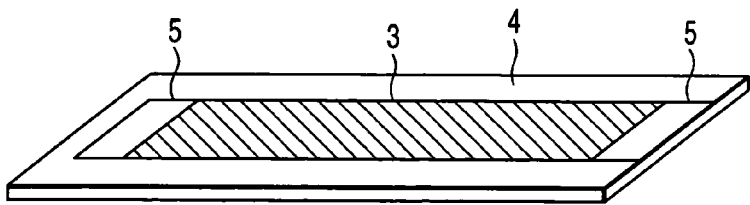
FIG. 15 is a perspective view showing the lower surface of the superconducting current limiting element in Example 4 of the present invention.

FIG. 14 is a perspective view showing the upper surface of a superconducting current limiting element in this example. FIG. 15 is a perspective view showing the lower surface of the superconducting current limiting element in this example.

In this example, Y-based superconducting thin films deposited on the surfaces of $CeO_2$ films by co-evaporation, which were epitaxially deposited on the upper and lower polished surfaces of an insulating substrate made of sapphire (R-plane) having a thickness of 1 mm, a width of 5 cm, and a length of 15 cm were used. The Y-based superconducting thin films on the both surfaces were processed to form a first superconductor 1 having a strip shape with a width of 1 cm and a length of 12 cm, and a second superconductor 3 having a strip shape with a width of 3 cm and a length of 12 cm. Ni thin films each having a width of 1 cm were deposited on both sides of the first superconductor 1 to use as normal conductors 2.

The first superconductor 1 had $I_c$ of about 130 A and the second superconductor 3 had $I_c$ of about 200 A as high as that in Example 3, respectively, under the liquid nitrogen temperature. A combined resistance of the first superconductor 1 and the normal conductors 2 was about 1Ω (at 100K), and the resistance of the second superconductor 3 was about 20Ω (at 100K).

The current limiting element fabricated in this manner was cooled in liquid nitrogen, and half-waves were supplied from an AC power supply (peak voltage of 1000V, internal resistance of 1Ω) of 50 Hz assuming a peak current value of 1000 A. FIG. 16 shows current limiting behavior of current limiting element according to this example. In FIG. 16, (a) shows the circuit current, (b) shows the voltage generated in the element, and (c) shows the resistance of the element.

At the time $t_1$ when the circuit current reached about 180 A, the parallel circuit of the first superconductor conductor 1 and the normal conductors 2 generated a voltage, and started to heat the second superconductor 3. In this case, it is expected that the second superconductor 3 starts to generate a voltage when the circuit current reaches about 280 A. However, at the time $t_2$ when the circuit current reached about 200 A, the second superconductor 3 actually started to generate a voltage. It can be judged from this result that the superconducting-to-normal transition of the second superconductor 3 was caused by an effect of heating.

The current limiting element of Example 4 has a critical current value of the superconductor and a current value for starting to generate a voltage substantially equal to those of the current limiting element of Example 3. However, comparing maximum passing current values in current limiting operation, the value was about 240 A for Example 3, while the value was about 200 A for Example 4, which is considerably lower than Example 3. It can be interpreted that this is because, in the element of Example 4, not only the heat generated in the normal conductors 2 but also that generated in the first superconductor 1 were used for raising the temperature of the second superconductor 3 and temperature rise of the second superconductor 3 is accelerated, unlike Example 3. Therefore, in a case where not only the higher resistance value finally provided but also reduction in the maximum passing current value against a fault current are required, the heat generated both in the first superconductor and in the normal conductor is preferably used for raising the temperature of the second superconductor as in the current limiting element of Example 4.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A superconducting current limiting element comprising:
   an insulating substrate;
   a parallel circuit including a first superconductor and a normal conductor connected in parallel, the first superconductor and the normal conductor being formed on a first surface of the insulating substrate; and
   a second superconductor connected in series to the parallel circuit and having a critical current value higher than that of the first superconductor, the second superconductor being formed on a second surface of the insulating substrate.

2. The superconducting current limiting element according to claim 1, wherein the first superconductor has a higher critical current density and causes transition to a normal-conducting state easier than the second superconductor.

3. The superconducting current limiting element according to claim 1, wherein the normal conductor is formed of nickel, and the first and second superconductors are formed of a Y-based superconductor, respectively.

4. The superconducting current limiting element according to claim 1, wherein the insulating substrate is formed of sapphire.

5. The superconducting current limiting element according to claim 4, wherein the second superconductor is epitaxially deposited on CeO2 which is epitaxially deposited on the sapphire substrate.

6. The superconducting current limiting element according to claim 4, wherein the first superconductor is epitaxially deposited on CeO2 which is epitaxially deposited on the sapphire substrate.

7. The superconducting current limiting element according to claim 1, wherein heat generated both in the first superconductor and in the normal conductor is conducted to the second superconductor.

* * * * *